(12) United States Patent
Yuen et al.

(10) Patent No.: US 11,456,575 B2
(45) Date of Patent: Sep. 27, 2022

(54) DISTRIBUTED OXIDE LENS FOR BEAM SHAPING

(71) Applicant: Lumentum Operations LLC, San Jose, CA (US)

(72) Inventors: Albert Yuen, Palo Alto, CA (US); Eric R. Hegblom, Sunnyvale, CA (US)

(73) Assignee: Lumentum Operations LLC, San Jose, CA (US)

( * ) Notice: Subject to any disclaimer, the term of this patent is extended or adjusted under 35 U.S.C. 154(b) by 238 days.

(21) Appl. No.: 16/719,270

(22) Filed: Dec. 18, 2019

(65) Prior Publication Data

US 2020/0169062 A1 May 28, 2020

Related U.S. Application Data

(63) Continuation-in-part of application No. 15/688,218, filed on Aug. 28, 2017, now Pat. No. 11,088,508.

(60) Provisional application No. 62/912,473, filed on Oct. 8, 2019.

(51) Int. Cl.
*H01S 5/183* (2006.01)

(52) U.S. Cl.
CPC ...... *H01S 5/18388* (2013.01); *H01S 5/18305* (2013.01); *H01S 5/18311* (2013.01); *H01S 5/18322* (2013.01); *H01S 5/18358* (2013.01); *H01S 5/18361* (2013.01)

(58) Field of Classification Search
CPC ................................................. H01S 5/18388
See application file for complete search history.

(56) References Cited

U.S. PATENT DOCUMENTS

| 5,073,041 A | * | 12/1991 | Rastani | H01S 5/423 372/101 |
| 5,633,527 A | * | 5/1997 | Lear | G02B 6/12004 257/101 |
| 5,822,356 A | * | 10/1998 | Jewell | H01S 5/18361 372/98 |

(Continued)

FOREIGN PATENT DOCUMENTS

| CN | 1702928 A | * | 11/2005 | ......... H01S 5/18313 |
| CN | 111181004 A | * | 5/2020 | ......... H01S 5/18308 |

(Continued)

OTHER PUBLICATIONS

Chang et al. ("Self-aligned microlens-integrated VCSELs", IEEE photonics Tech. Lttrs., vol. 18, No. 21, Nov. 2006) (Year: 2006).*

(Continued)

*Primary Examiner* — Tod T Van Roy
(74) *Attorney, Agent, or Firm* — Harrity & Harrity, LLP

(57) ABSTRACT

A vertical-cavity surface-emitting laser (VCSEL) may include a substrate and a set of epitaxial layers on the substrate. The set of epitaxial layers may include a first mirror and a second mirror, an active region between the first mirror and the second mirror, and an oxidation layer to provide optical and electrical confinement in the VCSEL. The oxidation layer may be near the first mirror. The set of epitaxial layers may include an oxide lens to control a characteristic of an output beam emitted by the VCSEL. The oxide lens may be separate from the oxidation layer, and may be a lens that is separate from the first mirror and from the second mirror.

20 Claims, 13 Drawing Sheets

(56) References Cited

U.S. PATENT DOCUMENTS

| | | | | |
|---|---|---|---|---|
| 5,881,085 A * | 3/1999 | Jewell | G02B 3/00 | 372/50.23 |
| 6,493,368 B1 * | 12/2002 | Chirovsky | H01S 5/18341 | 372/107 |
| 6,548,908 B2 * | 4/2003 | Chua | G02B 6/132 | 257/773 |
| 6,803,604 B2 * | 10/2004 | Takahashi | G02F 1/017 | 372/50.1 |
| 7,308,011 B2 * | 12/2007 | Johnson | H01S 5/18391 | 372/43.01 |
| 7,460,578 B2 * | 12/2008 | Guenter | H01S 5/18388 | 372/101 |
| 7,580,438 B2 * | 8/2009 | Mochizuki | B82Y 20/00 | 372/50.23 |
| 7,858,410 B2 * | 12/2010 | Watanabe | H01S 5/18388 | 257/E21.328 |
| 7,957,444 B2 * | 6/2011 | Itoh | B82Y 20/00 | 372/46.013 |
| 9,269,862 B2 * | 2/2016 | Lo | H01L 33/46 | |
| 9,318,872 B2 * | 4/2016 | Graham | H01S 5/183 | |
| 10,038,304 B2 * | 7/2018 | Joseph | H01S 5/423 | |
| 11,088,508 B2 * | 8/2021 | Yuen | H01S 5/18333 | |
| 11,099,393 B2 * | 8/2021 | Scheller | H01L 33/14 | |
| 2001/0006528 A1 * | 7/2001 | Sato | H01S 5/423 | 438/22 |
| 2002/0071471 A1 * | 6/2002 | Kim | H01L 33/10 | 257/E31.022 |
| 2003/0103516 A1 * | 6/2003 | Kitatani | H01S 5/18305 | 370/419 |
| 2003/0123514 A1 | 7/2003 | Cox et al. | | |
| 2003/0174750 A1 * | 9/2003 | Otsubo | H01S 5/18311 | 372/45.01 |
| 2008/0069166 A1 * | 3/2008 | Lee | H01S 5/18391 | 372/50.11 |
| 2008/0187015 A1 * | 8/2008 | Yoshikawa | H01S 5/18394 | 372/45.01 |
| 2009/0262765 A1 * | 10/2009 | Chang | H01S 5/18333 | 716/132 |
| 2010/0208764 A1 * | 8/2010 | Otoma | B82Y 20/00 | 372/50.1 |
| 2010/0328747 A1 * | 12/2010 | Jikutani | H04N 1/113 | 359/205.1 |
| 2011/0096806 A1 * | 4/2011 | Arakida | H01S 5/18313 | 372/50.21 |
| 2012/0071471 A1 | 3/2012 | Nardi et al. | | |
| 2012/0251039 A1 * | 10/2012 | Shimizu | H01S 5/18311 | 372/45.01 |
| 2012/0300800 A1 * | 11/2012 | Brenner | H01S 5/1021 | 372/45.01 |
| 2014/0050240 A1 * | 2/2014 | Shi | H01S 5/18316 | 372/45.01 |
| 2015/0155433 A1 * | 6/2015 | Lo | H01L 33/46 | 257/94 |
| 2016/0064900 A1 * | 3/2016 | Takeda | H01S 5/18361 | 372/45.01 |
| 2017/0063041 A1 * | 3/2017 | Kumei | H01S 5/18313 | |
| 2018/0226768 A1 * | 8/2018 | Brenner | H01S 5/18313 | |
| 2019/0067906 A1 * | 2/2019 | Yuen | G02B 6/4206 | |
| 2020/0169062 A1 * | 5/2020 | Yuen | H01S 5/18311 | |
| 2021/0091538 A1 * | 3/2021 | Chen | H01S 5/18341 | |
| 2022/0037856 A1 * | 2/2022 | Ghosh | H01S 5/18388 | |

FOREIGN PATENT DOCUMENTS

| | | | | |
|---|---|---|---|---|
| CN | 113809639 A | * | 12/2021 | |
| DE | 19813727 A1 | * | 9/1999 | H01S 5/18313 |
| GB | 2327533 | * | 1/1999 | |
| JP | 2003168845 A | * | 6/2003 | H01S 5/18305 |
| JP | 2006-073823 | * | 3/2006 | |
| JP | 2006294810 A | * | 10/2006 | H01S 5/0425 |
| JP | 2011096787 A | * | 5/2011 | H01S 5/0264 |
| KR | 20090077167 | * | 7/2009 | |
| TW | 447186 B | | 7/2001 | |
| TW | 200303107 A | | 8/2003 | |
| WO | WO-03034559 A1 | * | 4/2003 | H01S 5/18388 |
| WO | 2006039341 A2 | | 4/2006 | |
| WO | 2016008083 A1 | | 1/2016 | |
| WO | WO-2020065391 A1 | * | 4/2020 | H01S 5/18386 |
| WO | WO-2020150060 A1 | * | 7/2020 | H01S 5/04256 |

OTHER PUBLICATIONS

Song et al. ("Microlens-integrated VCSELs for large-tolerant fiber optic coupling", ICTON-MW, IEEE, 2007) (Year: 2007).*

Hegblom E. R., et al., "Scattering Losses from Dielectric Apertures in Vertical-Cavity Lasers," IEEE Journal of Selected Topics in Quantum Electronics, Apr. 1997, vol. 3(2), 11 pages.

Extended European Search Report for Application No. EP18189172.2, dated Jan. 23, 2019, 8 pages.

Naone et al., "Oxidation of AIGaAs layers for tapered apertures in vertical-cavity lasers", Electronic Letters, Feb. 13, 1997, vol. 33, No. 4, 2 pages.

Hegblom et al., "High Performance Small Vertical-Cavity Lasers: A Comparison of Measured Improvements in Optical and Current Confinement in Devices Using Tapered Apertures", IEE Journal of Selected Topics in Quantum Electronics, vol. 5, No. 3, May/Jun. 1999. 8 pages.

* cited by examiner

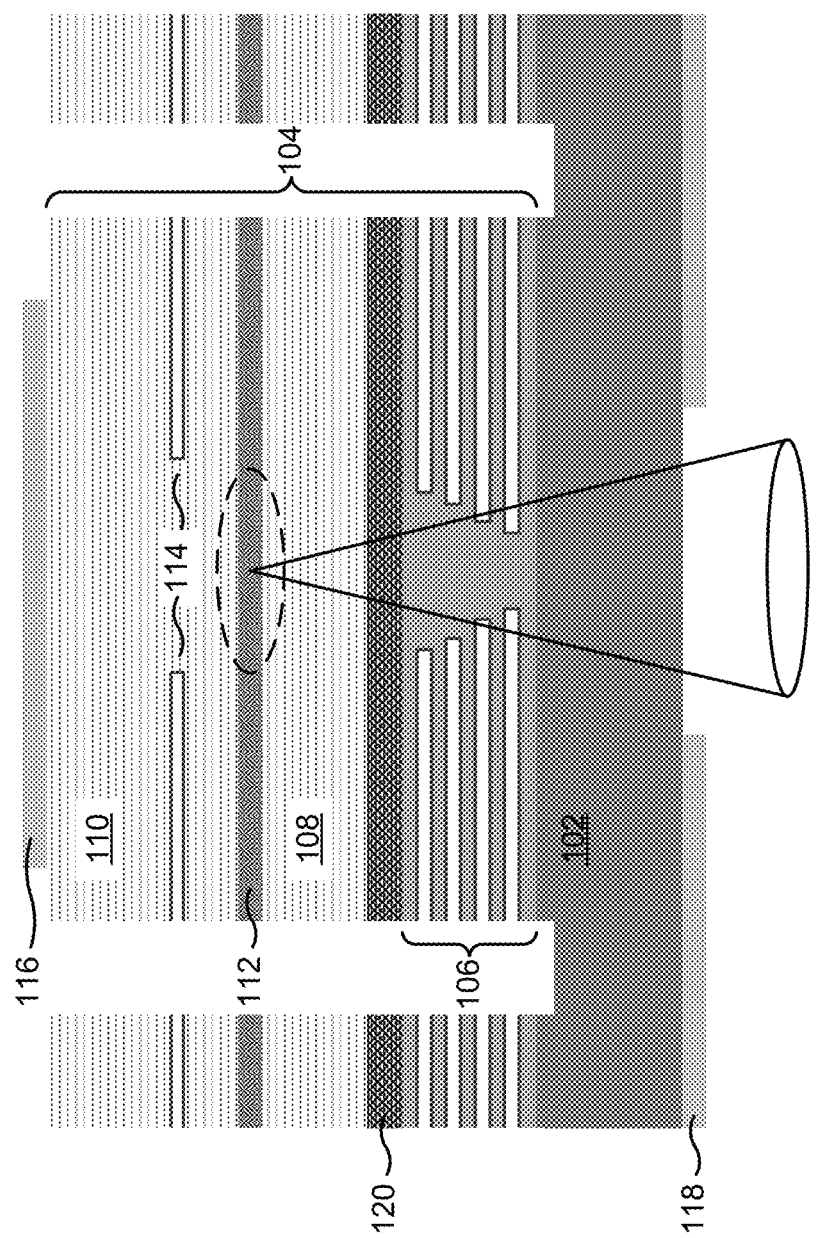

DISTRIBUTED OXIDE LENS FOR BEAM SHAPING

RELATED APPLICATION

This application claims priority under 35 U.S.C. § 119 to U.S. Provisional Patent Application No. 62/912,473, filed on Oct. 8, 2019, the content of which is incorporated by reference herein in its entirety.

This application is a Continuation-In-Part (CIP) of U.S. patent application Ser. No. 15/688,218, filed on Aug. 28, 2017, and entitled "CONTROLLING BEAM DIVERGENCE IN A VERTICAL-CAVITY SURFACE-EMITTING LASER," the content of which is incorporated by reference herein in its entirety.

TECHNICAL FIELD

The present disclosure relates to a vertical-cavity surface-emitting laser (VCSEL) and, more particularly, to a VCSEL including an oxide lens associated with tailoring an output beam of the VCSEL.

BACKGROUND

A VCSEL may be used in a variety of applications that require different optical mode characteristics. For example, for fiber optic communication, an optical mode of an output beam of a VCSEL may need to couple efficiently into a core of an optical fiber to maximize launched optical power. This requires a low numerical aperture (NA) or related spectral width to optimize the fiber coupling efficiency. However, a consumer application may require a larger NA or wider spectral width to reduce the amount of optical power that can be coupled into a human eye (e.g., for eye safety).

SUMMARY

According to some possible implementations, a VCSEL may include: a substrate, and a set of epitaxial layers on the substrate, the set of epitaxial layers including: a first mirror and a second mirror; an active region between the first mirror and the second mirror; an oxidation layer to provide optical and electrical confinement in the VCSEL, wherein the oxidation layer is near the first mirror; and an oxide lens to control a characteristic of an output beam emitted by the VCSEL, wherein the oxide lens is separate from the oxidation layer, and wherein the oxide lens is a lens that is separate from the first mirror and from the second mirror.

According to some possible implementations, a method may include: forming a first mirror, a second mirror, an active region, and an oxidation layer, wherein the active region is formed between the first mirror and the second mirror, wherein the oxidation layer is formed near the first mirror, and wherein the oxidation layer is to provide optical and electrical confinement of a VCSEL; and forming an oxide lens, wherein the oxide lens is separate from the oxidation layer, wherein the oxide lens is a lens that is separate from the first mirror and from the second mirror, and wherein the oxide lens is to control a characteristic of an output beam emitted by the VCSEL.

According to some possible implementations, an emitter wafer may include: a substrate, and a set of epitaxial layers on the substrate, the set of epitaxial layers including: an active region between a first mirror and a second mirror; an oxidation layer near the first mirror; and an oxide lens, wherein the oxide lens is separated from the oxidation layer by at least a portion of the first mirror or at least a portion of the second mirror, wherein the oxide lens is a lens that is separate from the first mirror and from the second mirror, and wherein the oxide lens is to control an effective index of refraction encountered by an output beam of an emitter in the emitter wafer in association with controlling a characteristic of the output beam.

BRIEF DESCRIPTION OF THE DRAWINGS

FIGS. 5A and 5B are diagrams of example cross-sections of VCSELs including an oxide lens and a spacer layer within an epitaxial structure, as described herein.

DETAILED DESCRIPTION

Figure 1:
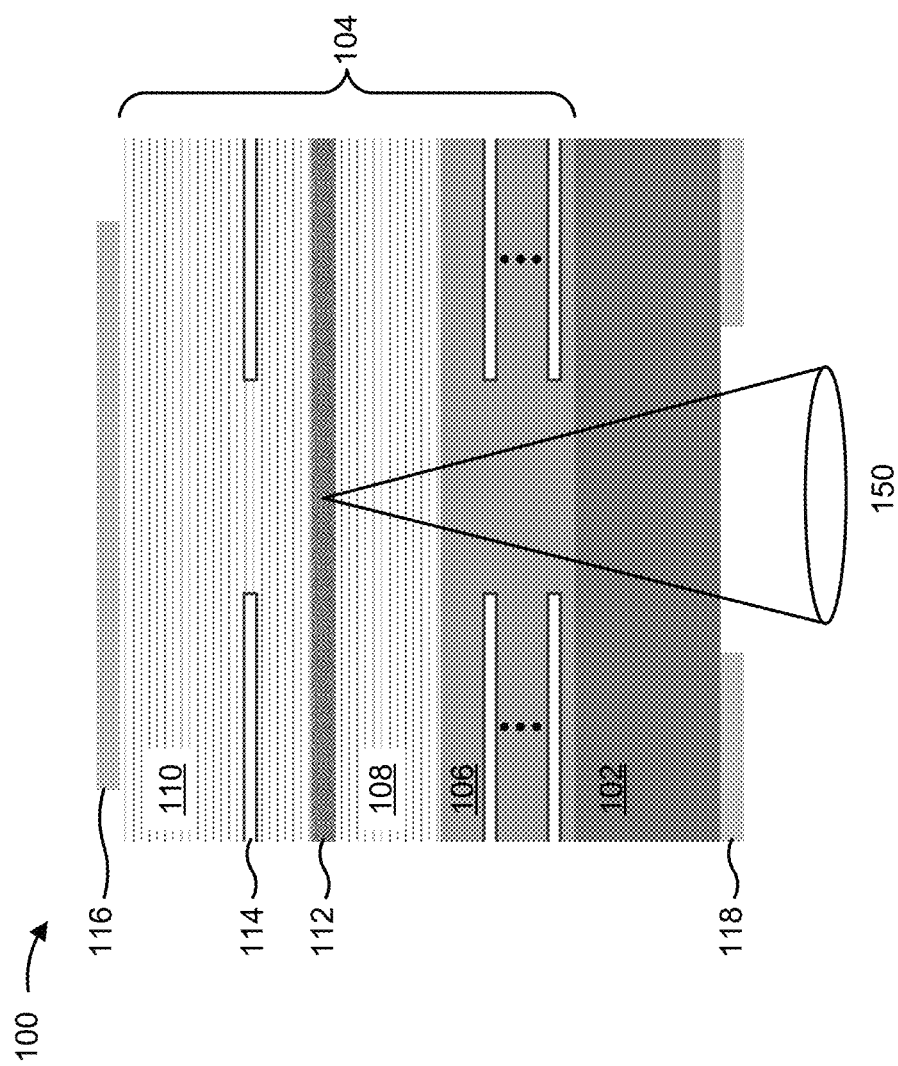
FIG. 1 is a diagram illustrating an example cross-section of a VCSEL including an oxide lens within an epitaxial structure, as described herein.

The following detailed description of example implementations refers to the accompanying drawings. The same reference numbers in different drawings may identify the same or similar elements.

As described above, a VCSEL may be used in a variety of applications that require different NAs and related spectral widths. For example, a lower NA and narrower spectral width may be needed in a datacom application (e.g., to increase fiber coupling efficiency and/or increase a transmission distance), while a higher NA and wider spectral width may be needed in a consumer application (e.g., to reduce an amount of light entering a human eye, to improve eye safety or reduce speckle). Thus, the ability to tailor an NA and a spectral width of a VCSEL would provide flexibility to designers to fit requirements of a given application.

One technique for providing an ability to tailor an optical characteristic of an output beam is to design mirrors (e.g., distributed Bragg reflectors (DBRs)) of an epitaxial structure of a VCSEL to have higher or lower refractive indices by changing stoichiometry of individual layers of the mirrors (e.g., by increasing aluminum content in aluminum gallium arsenide (AlGaAs) from $Al_{0.5}Ga_{0.5}As$ to $Al_{0.7}Ga_{0.3}As$). Another technique includes using a dopant (for example, zinc (Zn)) to intermix a P-type DBR in select regions around an optical mode to alter an effective refractive index and change optical mode confinement. Still another technique includes using ion implantation in select regions around the optical mode to alter the effective refractive index and change the optical mode and electrical confinement. Another technique includes selecting a shape and size of mesa or trench etch patterns to alter the effective refractive index and change the optical mode confinement. However, the above described techniques generally do not provide a way to steer an output beam at an angle away from normal to the surface.

Other techniques include etching a diffractive or refractive lens in the substrate, and depositing a particular polymer (on an output surface of the VCSEL) that is designed in such a way as to have a refractive index profile to shape the output beam in a desired fashion. However, these techniques necessitate additional processing steps (e.g., steps in addition to conventional VCSEL processing steps) and/or result in comparatively lower yield. Further, a polymer lens does provide a way to steer the output beam, but the use of polymers may not be desired because adhesion to a semiconductor may be problematic, particularly under environmental tests like thermal cycling or thermal shock, or high humidity and temperature. Similarly, etching a lens in the substrate backside can provide a way to steer the optical beam, but works only if the substrate is transparent (e.g., as typically for GaAs for wavelengths longer than 930 nm), but for shorter wavelengths, a GaAs substrate absorbs too much light and it is desirable to form a lens on the top surface of the wafer (i.e., on the epitaxial side of the wafer).

Some implementations described herein provide a VCSEL including an epitaxial structure comprising an oxide lens that enables flexible design for optical characteristics of an output beam of a VCSEL. In some implementations, the oxide lens enables design flexibility by allowing for control of an effective index of refraction encountered by the output beam of the VCSEL. In some implementations, a length, a thickness, an amount of tapering, a placement of layers of the oxide lens, and/or one or more other characteristics of the oxide lens may provide a lensing effect that causes the output beam to have a desired optical characteristic. For example, for a narrower spectral width, a diverging output beam can be collimated or focused by an oxide lens formed to have a refractive index profile that has properties of a convex lens. As another example, for a wider spectral width, divergence of an output beam can be increased by an oxide lens formed to have a refractive index profile that has properties of a concave lens. In some implementations, as described below, the oxide lens may be located above or below a mirror structure (e.g., a DBR) of the VCSEL.

FIG. 1 is a diagram illustrating an example cross-section of a VCSEL 100 including an oxide lens within an epitaxial structure. As shown in FIG. 1, VCSEL 100 may include a substrate 102, an epitaxial structure 104 (e.g., including an oxide lens 106, a bottom mirror 108, an active region 112, an oxidation layer 114, and a top mirror 110), a top contact layer 116, and bottom contact layer 118. In some implementations, VCSEL 100 may be manufactured using a series of procedures. For example, one or more layers of VCSEL 100 may be created using one or more growth procedures, one or more deposition procedures, one or more etching procedures, one or more oxidation procedures, one or more implantation procedures, one or more metallization procedures, and/or the like.

Substrate 102 includes a substrate upon which epitaxial structures 104 are grown. In some implementations, substrate layer may be formed from a semiconductor material, such as gallium arsenide (GaAs), indium phosphide (InP), and/or another type of semiconductor material.

Epitaxial structure 104 include a set of layers grown on substrate layer 204. For example, epitaxial structure 104 may include an optical resonator including a pair of reflectors (e.g., a pair of DBRs, a pair of dielectric mirrors, and/or the like), an oxide lens associated with controlling of an effective refractive index encountered by an output beam 150 of VCSEL, an active gain medium (herein referred to as an active region), one or more layers used to form one or more apertures (e.g., for optical and/or electrical confinement), and/or the like, as described below. In some implementations, epitaxial structure 104 may include a set of AlGaAs layers grown on substrate 102 (e.g., a GaAs substrate). In some implementations, epitaxial structure 104 may be grown on substrate 102 using a metal-organic chemical vapor deposition (MOCVD) technique, a molecular beam epitaxy (MBE) technique, and/or the like. As shown, epitaxial structure 104 of VCSEL 100 may include oxide lens 106, bottom mirror 108, top mirror 110, active region 112, and oxidation layer 114.

Oxide lens 106 includes a group of layers associated with controlling one or more characteristics of output beam 150 emitted by VCSEL 100. For example, oxide lens 106 may include layers of epitaxial structure 104 that are designed to control an effective index of refraction encountered by output beam 150, in association with controlling the one or more characteristics of output beam 150. In general, if the effective index step between an oxide region and a non-oxide region is relatively high and/or the oxide region is relatively close to an active region, then optical confinement of an optical mode is higher, which would cause an output beam to diverge. Similarly, if the effective index step between an oxide region and a non-oxide region is relatively low and/or the oxide region is relatively far from the active region, then optical confinement of an optical mode is lower, which would cause an output beam to converge. Thus, oxidized layers and non-oxidized layers of oxide lens 106 may be used to form an effective lens or, in the case of oxidized layers on one side (e.g., such that an asymmetrical oxidation profile is formed), may be formed to perturb optical modes of an output beam (e.g., to affect a mode pattern in a desired manner).

In some implementations, oxide lens 106 can be fabricated, by a unique trench design (e.g., asymmetric or symmetric), so as to create a perturbation to spatial optical modes of output beam 150 and filter a number of modes or change shape of an optical mode pattern. This same symmetric or asymmetric oxide lens 106 may be used to beam steer output beam 150. In some implementations, to create this effect, a trench may be placed at a different distance or radial angle than other trenches so as to create an intentional asymmetric oxide aperture shape tailored to the desired mode pattern or output beam 150 steering angle.

In some implementations, oxide lens 106 may include one or more epitaxial layer pairs, where each epitaxial layer pair includes an oxidized layer and a non-oxidized layer. In FIG. 1, oxidized layers are represented as partially white layers in oxide lens 106, while non-oxidized layers are represented as entirely gray layers in oxide lens 106. In some implementations, an oxidized layer of a given epitaxial layer pair may be, for example, an aluminum oxide ($Al_2O_3$) layer formed as a result of oxidation of an AlGaAs layer with a high aluminum content (e.g., comprising approximately $Al_{0.8}$ or more), while a corresponding non-oxidized layer of the given epitaxial layer pair may be a layer that does not experience significant oxidation (e.g., a GaAs layer, an AlGaAs layer with a low aluminum content, such as approximately $Al_{0.1}$ or less). In some implementations, oxidation lengths may differ among oxidized layers of oxide lens 106.

In some implementations, as shown in FIG. 1, oxide lens 106 is separate from oxidation layer 114. That is, in some implementations, oxide lens 106 may not be integrated with oxidation layer 114, meaning that the function and design of oxidation layer 114 and the function and design of oxide lens 106 are independent of one another. In some implementations, oxide lens 106 may be physically separated from oxidation layer 114 by at least a portion of one or more mirrors (e.g., bottom mirror 108 and/or top mirror 110).

In some implementations, oxide lens 106 is a lens that is separate from top mirror 110 and from bottom mirror 108. That is, in some implementations, a lensing effect provided by oxide lens 106 is independent and/or separate from a lensing effect provided by top mirror 110 and/or bottom mirror 108. In some implementations, oxide lens 106 is arranged on a mirror surface via which output beam 150 is to be emitted. For example, as shown in FIG. 1, oxide lens 106 may be arranged on a bottom surface of bottom mirror 108. As another example, oxide lens 106 may be arranged on a top surface of top mirror 110, an example of which is described below. In some implementations, a functionality of oxide lens 106 may be separate from that of the mirror on which oxide lens 106 is arranged. For example, in some implementations, the functionality of oxide lens 106, even when arranged on a mirror surface of a given mirror of VCSEL 100 (e.g., bottom mirror 108 as shown in FIG. 1), may be separate from the functionality of the given mirror of VCSEL 100.

Alternatively, in some implementations, oxide lens 106 may not be separate from a particular mirror of VCSEL 100. That is, in some implementations, oxide lens 106 may be integrated with a particular mirror of VCSEL 100 (e.g., bottom mirror 108 or top mirror 110), meaning that the function and design of the particular mirror and the function and design of oxide lens 106 may be dependent on each other.

In some implementations, the one or more characteristics of output beam 150 that may be controlled by oxide lens 106 may include, for example, an effective index of refraction encountered by output beam 150, a beam divergence of output beam 150, a beam steering angle of output beam 150, a number of optical modes of output beam 150, a shape of an optical mode pattern of output beam 150, and/or another optical characteristic.

In some implementations, the one or more characteristics of output beam 150 may be controlled based on one or more properties of one or more layers of oxide lens 106. In some implementations, these one or more properties may be selected so as to control an effective index step encountered by output beam 150 in order to impart a desired characteristic on output beam 150.

In some implementations, the one or more properties of oxide lens 106 that may be used to define the effective refractive index may include, for example, a number of oxidized layers included in oxide lens 106, a number of non-oxidized layers in oxide lens 106, and/or a number of oxidized/non-oxidized layer pairs in oxide lens 106.

As another example, the one or more properties of oxide lens 106 may include a thickness of one or more layers (e.g., one or more oxidized layers and/or one or more non-oxidized layers) included in oxide lens 106.

As another example, the one or more properties of oxide lens 106 may include a distance between a pair of oxidized layers included in oxide lens 106, or a distance between a pair of non-oxidized layers 106 included in oxide lens 106.

As another example, the one or more properties of oxide lens 106 may include a composition of one or more layers included in oxide lens 106 (e.g., an aluminum content of a given layer included in oxide lens 106).

As another example, the one or more properties of oxide lens 106 may include oxidation lengths of one or more oxidized layers included in oxide lens 106. Here, an oxidation length of a given oxidized layer of oxide lens is illustrated in FIG. 1 as a horizontal length of a white portion of the given oxidized layer.

As another example, the one or more properties of oxide lens 106 may include an oxidation profile of oxide lens 106. The oxidation profile of oxide lens 106 is a profile of oxidized layers in oxide lens 106 as defined by oxidation lengths of oxidized layers in oxide lens 106. In some implementations, oxide lens 106 may have an oxidation profile that is substantially symmetric about a center of an optical aperture defined by oxidation layer 114, examples of which are described below. In some implementations, oxide lens 106 may have an oxidation profile that is substantially asymmetric about the center of the optical aperture defined by oxidation layer 114, an example of which is described below.

As another example, the one or more properties of oxide lens 106 may include a distance between oxide lens 106 and active region 112.

Bottom mirror 108 includes a bottom reflector of an optical resonator of VCSEL 100. For example, bottom mirror 108 may include a DBR, a dielectric mirror, and/or the like. In some implementations, bottom mirror 108 may have a thickness in a range from approximately 3.5 µm to approximately 9 µm, such as 5 µm.

Active region 112 includes one or more layers where electrons and holes recombine to emit light and define the emission wavelength range of the VCSEL 100. For example, active region 112 may include one or more quantum wells. In some implementations, active region 112 may include one or more cavity spacer layers between top mirror 110 and bottom mirror 108. The optical thickness of active region 112 (including cavity spacer layers) and optical thickness of top mirror 110 and bottom mirror 108 define the resonant cavity wavelength of the VCSEL 100, which may be designed within an emission wavelength range of the active region to enable lasing. In some implementations, active region 112 may have a thickness in a range from approximately 0.06 µm to approximately 0.5 µm, such as 0.15 µm or 0.30 µm.

Oxidation layer 114 includes an oxide layer that provides optical and electrical confinement. In some implementations, oxidation layer 114 may be formed as a result of oxidation of one or more epitaxial layers of epitaxial structure 104. For example, oxidation layer 114 may be an aluminum oxide ($Al_2O_3$) layer formed as a result of oxidation of an epitaxial layer (e.g., an AlGaAs layer, an aluminum arsenide (AlAs) layer, and/or the like). In some implementations, as shown in FIG. 1, oxidation layer 114 may be near (e.g., adjacent to, but below top mirror 110). In some implementations, oxidation layer 114 may have a thickness in a range from approximately 0.007 µm to approximately 0.04 µm, such as 0.02 µm. In some implementations, oxidation trenches (not shown) etched around VCSEL 100 may allow steam to access the epitaxial layer(s) from which oxidation layer 114 is formed. Oxidation layer 114 may define an oxidation aperture (e.g., an optically active aperture). In some implementations, the oxide aperture may be a non-circular shape, but a circle of approximately the same area may have a diameter in a range from approximately 1 µm to approximately 300 µm, such as 5 µm or 8 µm.

Top mirror 110 includes a top reflector layer of VCSEL 100. For example, top mirror 110 may include a DBR, a dielectric mirror, and/or the like. In some implementations, top mirror 110 may have a thickness in a range from approximately 2 µm to approximately 6 µm, such as 4 µm.

Top contact layer 116 includes a layer that makes electrical contact with epitaxial structure 104 (e.g., top mirror 110) through which current may flow. In some implementations, top contact layer 116 may include an annealed metallization layer. For example, top contact layer 116 may include a chromium-gold (Cr—Au) layer, gold-zinc (Au—Zn), a titanium-platinum-gold (TiPtAu) layer, or the like, through which electrical current may flow. In some implementations, top contact layer 116 may have a thickness in a range from approximately 0.03 µm to approximately 0.3 µm, such as 0.2 µm. In some implementations, top contact layer 116 may have a ring shape, a slotted ring shape, a tooth wheel shape, or another type of circular or non-circular shape (e.g., depending on a design of VCSEL 100). In some implementations, top contact layer 116 may be a cathode layer or may be an anode layer.

Bottom contact layer 118 includes a layer at a backside of an emitter. For example, bottom contact layer 118 can include an electrode layer that makes electrical contact with substrate 102 (e.g., a backside of substrate 102, shown as a bottom side of substrate 102 in FIG. 1). As a particular example, bottom contact layer 118 may include an annealed metallization layer, such as a gold-germanium-nickel (AuGeNi) layer, a palladium-germanium-gold (PdGeAu) layer, and/or the like. In some implementations, bottom contact layer 118 may be a cathode layer or may be an anode layer.

Notably, FIG. 1 illustrates a bottom-emitting configuration of VCSEL 100. A top-emitting configuration of VCSELs is also contemplated, an example of which is described in greater detail further below.

The number and arrangement of layers shown in FIG. 1 are provided as an example. In practice, VCSEL 100 may include additional layers, fewer layers, different layers, or differently arranged layers than those shown in FIG. 1. Additionally, or alternatively, a set of layers (e.g., one or more layers) of VCSEL 100 may perform one or more functions described as being performed by another set of layers of VCSEL 100.

FIGS. 2, 3, 4, 5A, and 5B provide various example cross-sections of VCSELs 100 including an oxide lens 106 within an epitaxial structure 104.

Figure 2:
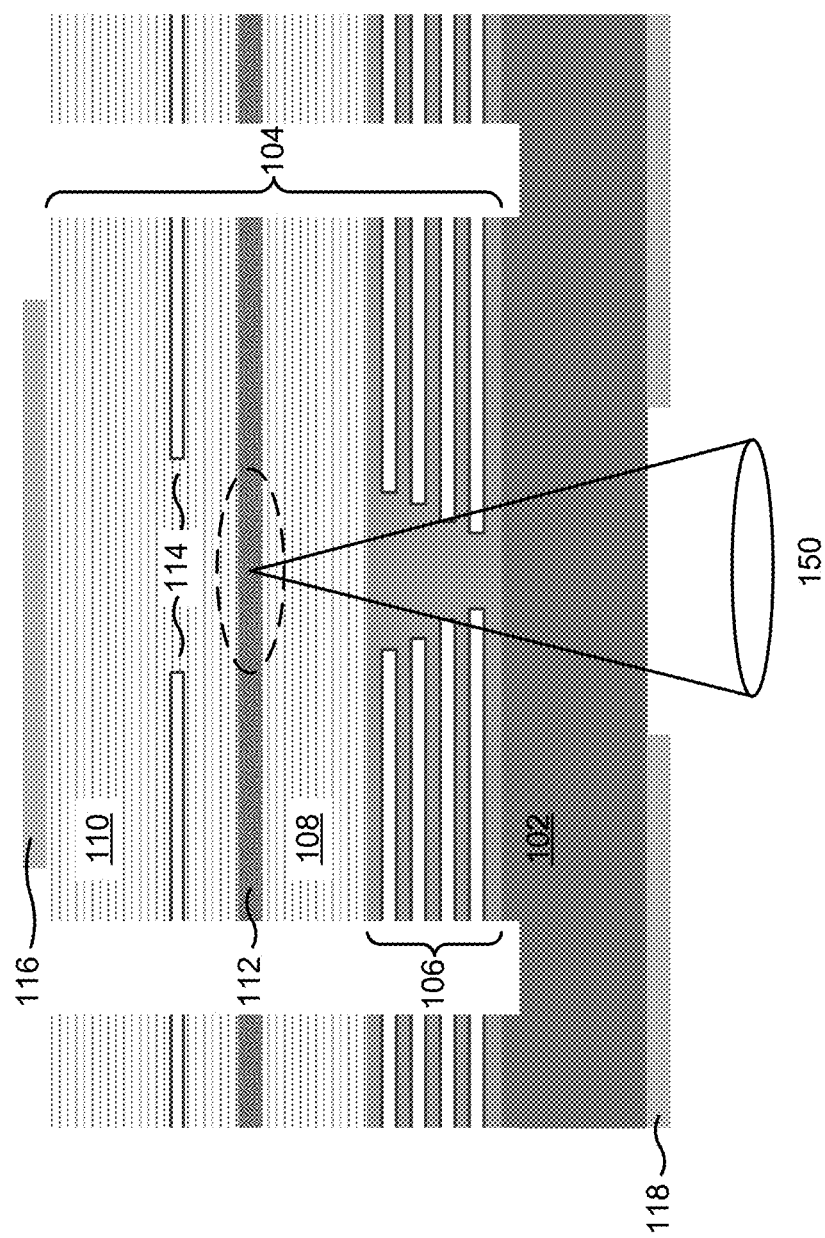
FIG. 2 is a diagram illustrating an example cross-section of a bottom-emitting VCSEL including an oxide lens within an epitaxial structure, as described herein.

FIG. 2 is a diagram of an example cross-section of a bottom-emitting VCSEL 100 including an oxide lens 106 within an epitaxial structure 104. In FIG. 2, oxide lens 106 has an oxidation profile that is substantially symmetric about a center of an optical aperture defined by oxidation layer 114. In such a case, as shown in FIG. 2, an oxidation profile (e.g., as defined by oxidized layers of oxide lens 106) may be substantially symmetric about the center of the optical aperture. Notably, in the example shown in FIG. 2, oxide lens 106 is arranged below bottom mirror 108 and active region 112.

Figure 3:
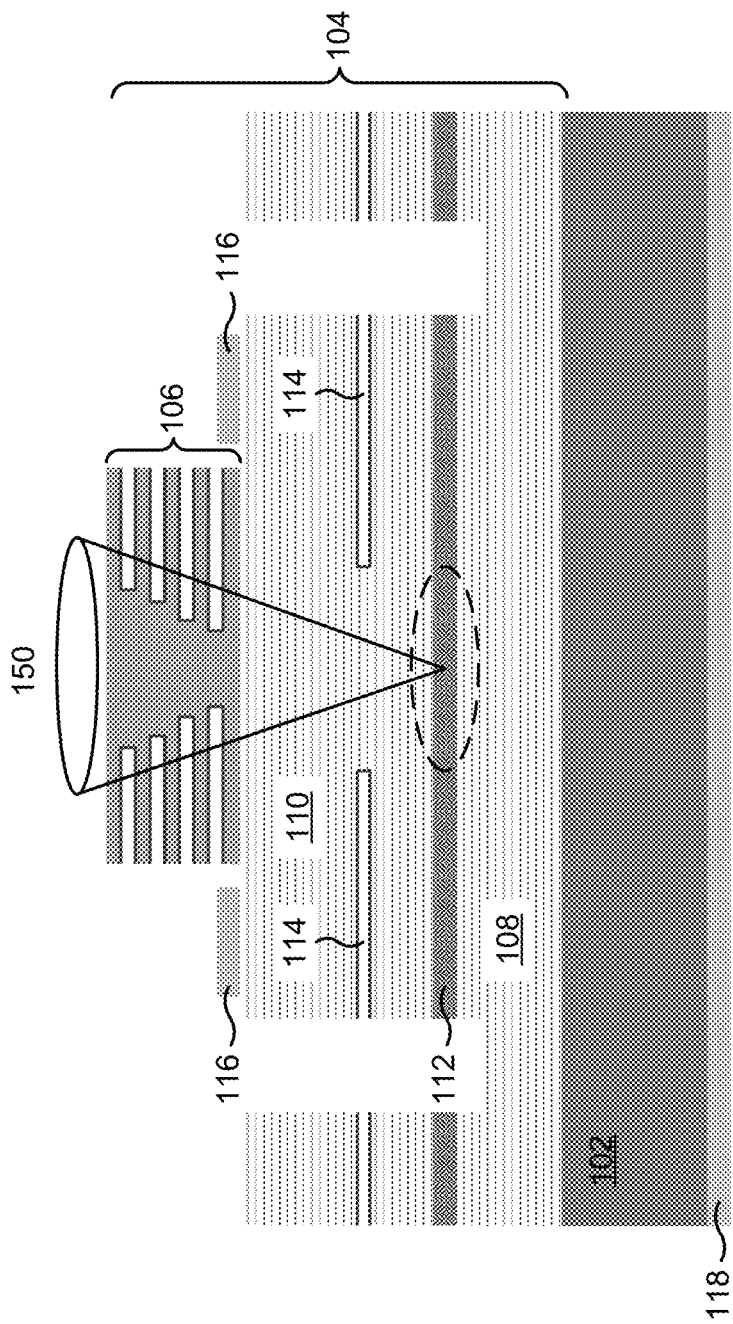
FIG. 3 is a diagram of an example cross-section of a top-emitting VCSEL including an oxide lens within an epitaxial structure, as described herein.

FIG. 3 is a diagram of an example cross-section of a top-emitting VCSEL 100 including an oxide lens 106 within an epitaxial structure 104. In FIG. 3, oxide lens 106 has an oxidation profile that is substantially symmetric about a center of an optical aperture defined by oxidation layer 114. In such a case, as shown in FIG. 3, an oxidation profile (e.g., as defined by oxidized layers of oxide lens 106) may be substantially symmetric about the center of the optical aperture. Notably, in the example shown in FIG. 3, oxide lens 106 is arranged above top mirror 110 and active region 112.

Figure 4:
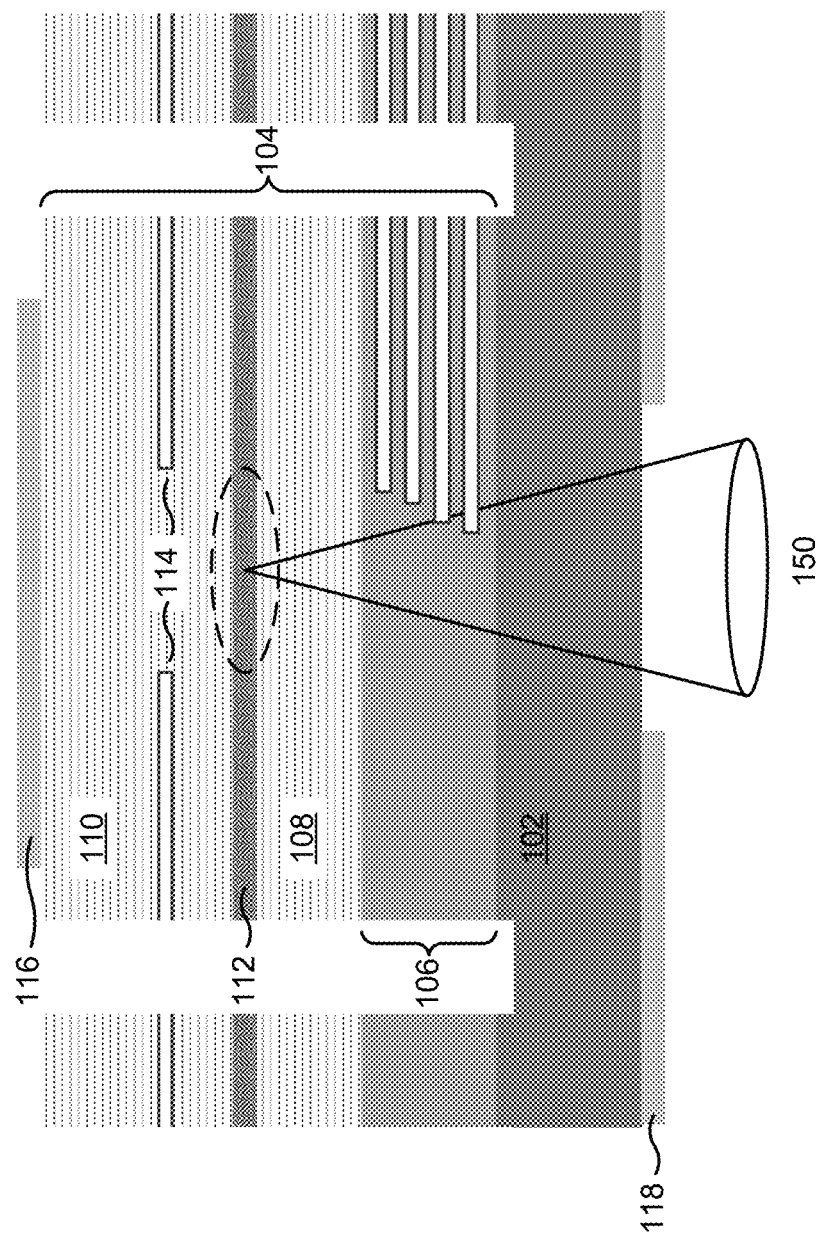
FIG. 4 is a diagram of an example cross-section of a VCSEL including an asymmetric oxide lens within an epitaxial structure, as described herein.

FIG. 4 is a diagram of an example cross-section of a VCSEL 100 including an asymmetric oxide lens 106 within an epitaxial structure 104. In FIG. 4, oxide lens 106 has an oxidation profile that is substantially asymmetric about a center of an optical aperture defined by oxidation layer 114. In such a case, as shown in FIG. 4, an oxidation profile (e.g., as defined by oxidized layers of oxide lens 106) may be substantially asymmetric about the center of the optical aperture (e.g., such that oxidized layers of oxide lens 106 are on only one side of the center of the optical aperture). Notably, in the example shown in FIG. 4, oxide lens 106 is arranged below bottom mirror 108 and active region 112.

Figure 5B:
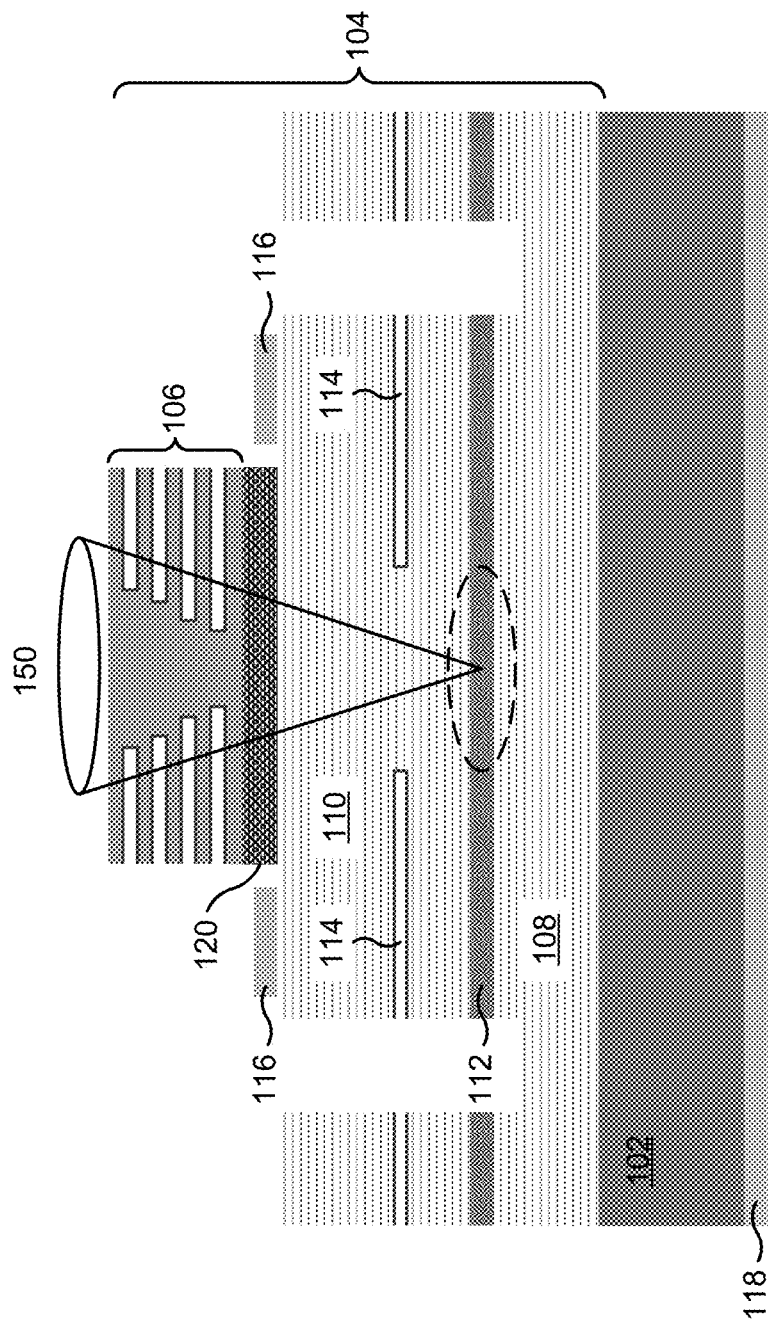

In some implementations, epitaxial structure 104 may include a spacer layer between active region 112 and oxide lens 106. FIGS. 5A and 5B are diagrams of example cross-sections of VCSELs 100 including oxide lenses 106 and spacer layers 120 within an epitaxial structure 104. In some implementations, spacer layer 120 may provide (further) separation between active region 112 and oxide lens 106. In some implementations, spacer layer 120 may be used to increase a distance between oxide lens 106 and active region 112 in order to impart a desired optical characteristic on output beam 150 (e.g., by allowing output beam 150 to further diverge before encountering oxide lens 106).

The number and arrangement of layers shown in FIGS. 2, 3, 4, 5A, and 5B are provided as examples. In practice, VCSEL 100 may include additional layers, fewer layers, different layers, or differently arranged layers than those shown in FIGS. 2, 3, 4, 5A, and 5B. Additionally, or alternatively, a set of layers (e.g., one or more layers) of VCSEL 100 may perform one or more functions described as being performed by another set of layers of VCSEL 100.

Figure 6:
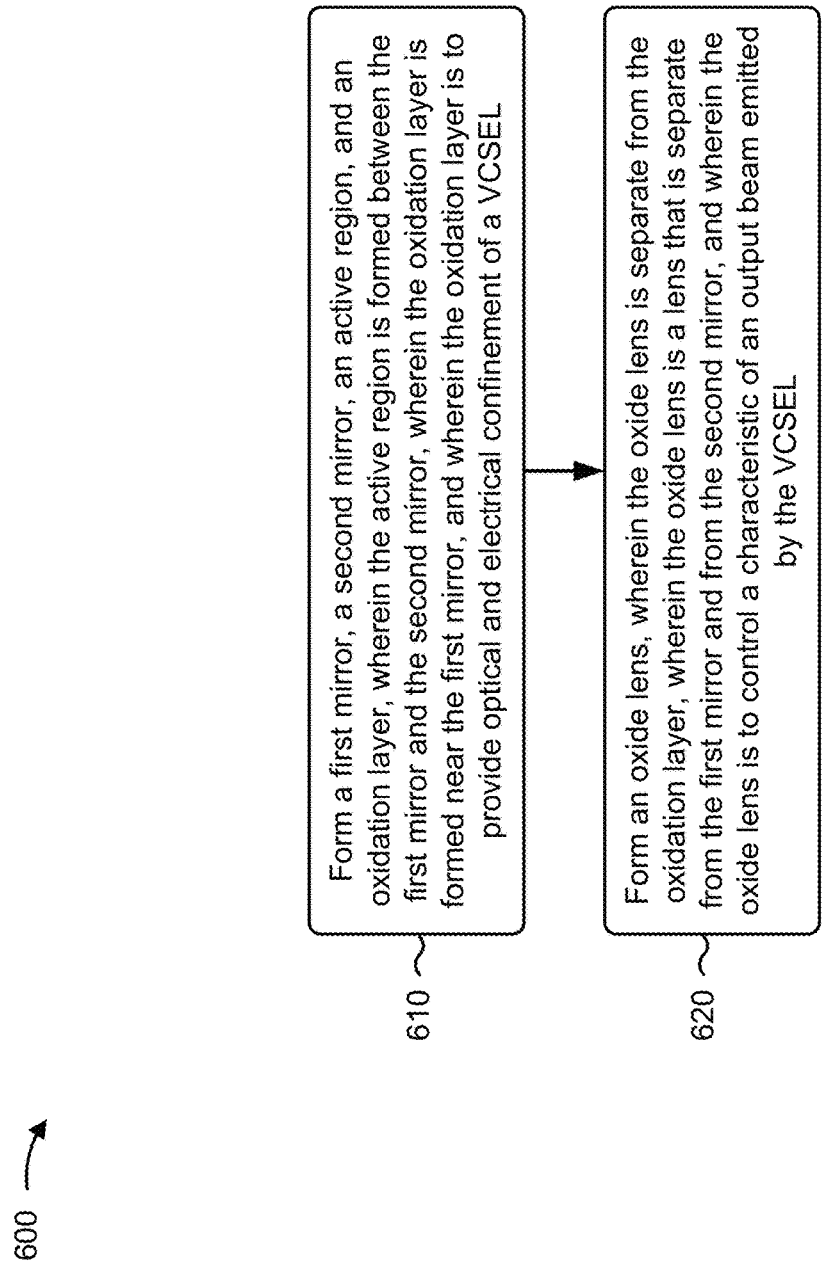
FIG. 6 is a flowchart of an example process for forming a VCSEL including an oxide lens within an epitaxial structure, as described herein.

FIG. 6 is a flowchart of an example process 600 for forming a VCSEL (e.g., VCSEL 100) including an oxide lens 106 within epitaxial structure 104, as described herein.

As shown in FIG. 6, process 600 may include forming a first mirror, a second mirror, an active region, and an oxidation layer, wherein the active region is formed between the first mirror and the second mirror, wherein the oxidation layer is formed near the first mirror, and wherein the oxidation layer is to provide optical and electrical confinement of a VCSEL (block 610). For example, top mirror 110, bottom mirror 108, active region 112, and oxidation layer 114 may be formed, as described above. In some implementations, oxidation layer 114 may be formed near top mirror 110. In some implementations, oxidation layer 114 may provide optical an electrical confinement of the VCSEL.

As further shown in FIG. 6, process 600 may include forming an oxide lens wherein the oxide lens is separate from the oxidation layer, wherein the oxide lens is a lens that is separate from the first mirror and from the second mirror, and wherein the oxide lens is to control a characteristic of an output beam emitted by the VCSEL (block 620). In some implementations, oxide lens 106 may be separate from oxidation layer 114. In some implementations, oxide lens 106 is a lens that is separate from top mirror 110 and bottom mirror 108. In some implementations, oxide lens 106 may control a characteristic of output beam 150 emitted by the VCSEL. In some implementations, oxide lens 106 may be formed on a mirror surface via which output beam 150 is to be emitted by the VCSEL, where the mirror surface is either a surface of top mirror 110 (e.g., when the VCSEL is a top-emitting VCSEL) or a surface of bottom mirror 108 (e.g., when the VCSEL is a bottom-emitting VCSEL).

In some implementations, oxide lens 106 may be formed using a same trench as that used for forming oxidation layer 114. In such a case, a single oxidation step may be used to form oxidation layer 114 and oxide lens 106. Here, a variation in composition of epitaxial layers used to form oxidation layer 114 and oxide lens 106 may be selected so as to control oxidation lengths of oxidation layer 114 and layers of oxide lens 106.

Alternatively, in some implementations, oxide lens 106 may be formed using a separate trench than a trench used for forming oxidation layer 114 (e.g., a trench etched at a comparatively greater distance from a center of VCSEL 100 than the trench used to form oxidation layer 114). Here, a depth of the trench used for forming oxidation layer 114 may be reduced (as compared to the single trench approach described above), which may reduce stress on one or more other layers of VCSEL 100 (e.g., layers of bottom mirror 108, layers of top mirror 110) and/or may prevent unwanted oxidation of one or more other layers of VCSEL 100 (e.g., so as to avoid creation of so-called fins).

Process 600 may include additional implementations, such as any single implementation or any combination of implementations described below and/or in connection with one or more other processes described elsewhere herein.

In a first implementation, when the VCSEL is a bottom-emitting VCSEL, the first mirror is top mirror 110, the second mirror is bottom mirror 108, and the mirror surface is a surface of bottom mirror 108. Here, oxide lens 106 may be between substrate 102 and bottom mirror 108.

In a second implementation, when the VCSEL is a top-emitting VCSEL, the first mirror is top mirror 110, the second mirror is bottom mirror 108, and the mirror surface is a surface of top mirror 110.

In a third implementation, process 600 further includes forming spacer layer 120 associated with providing separation between active region 112 and oxide lens 106. Here, spacer layer 120 may be between the mirror surface and oxide lens 106.

In a fourth implementation, the characteristic of output beam 150 may be controlled based on a number of layers included in oxide lens 106, thicknesses of one or more layers included in oxide lens 106, distances between particular pairs of layers included in oxide lens 106, composition of layers included in oxide lens 106, oxidation lengths of oxidized layers included in oxide lens 106, an oxidation profile of oxide lens 106, and/or a distance between oxide lens 106 and active region 112.

In a fifth implementation, the characteristic to be controlled by oxide lens 106 is a beam divergence of output beam 150, a beam steering angle of output beam 150, a number of optical modes, or a shape of an optical mode pattern.

In a sixth implementation, oxide lens 106 includes a set of epitaxial layer pairs, each epitaxial layer pair including an oxidized layer and a non-oxidized layer.

In a seventh implementation, an oxidation length of a first oxidized layer, included in a first epitaxial layer pair of the set of epitaxial layer pairs, is different from an oxidation length of a second oxidized layer included in a second epitaxial layer pair of the set of epitaxial layer pairs.

In an eighth implementation, oxide lens 106 has an oxidation profile that is substantially symmetric about a center of an optical aperture defined by oxidation layer 114.

In a ninth implementation, oxide lens 106 has an oxidation profile that is substantially asymmetric about a center of an optical aperture defined by oxidation layer 114.

In a tenth implementation, oxide lens 106 has a sloped profile associated with providing beam steering away from VCSEL 100.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

A potential issue with directing an output beam using oxidized layers (e.g., oxidized Aluminum layers) is that, without an anti-reflection (AR) coating, the oxidized layers may reflect light back to a laser cavity of the VCSEL or in an undesired direction. In some cases, if the reflections are back to the VCSEL, these reflections may help to adjust a mode shape of the output beam. However, in some cases, it may be desirable to aim the output beam in a different direction without disturbing the laser cavity.

Therefore, in some implementations, lens 106 may be formed with a sloped profile that provides beam steering away from VCSEL 100. For example, lens 106 can be formed on a top side of VCSEL 100 (e.g., when VCSEL 100 is a top-emitting VCSEL), and can be formed based on oxidizing a set of oxidized layers that is oxidized from one side only (with the other side being protected from oxidation). FIGS. 7A-7F are diagrams illustrating steps of example processes for forming lens 106 including a sloped profile.

Figure 7A:
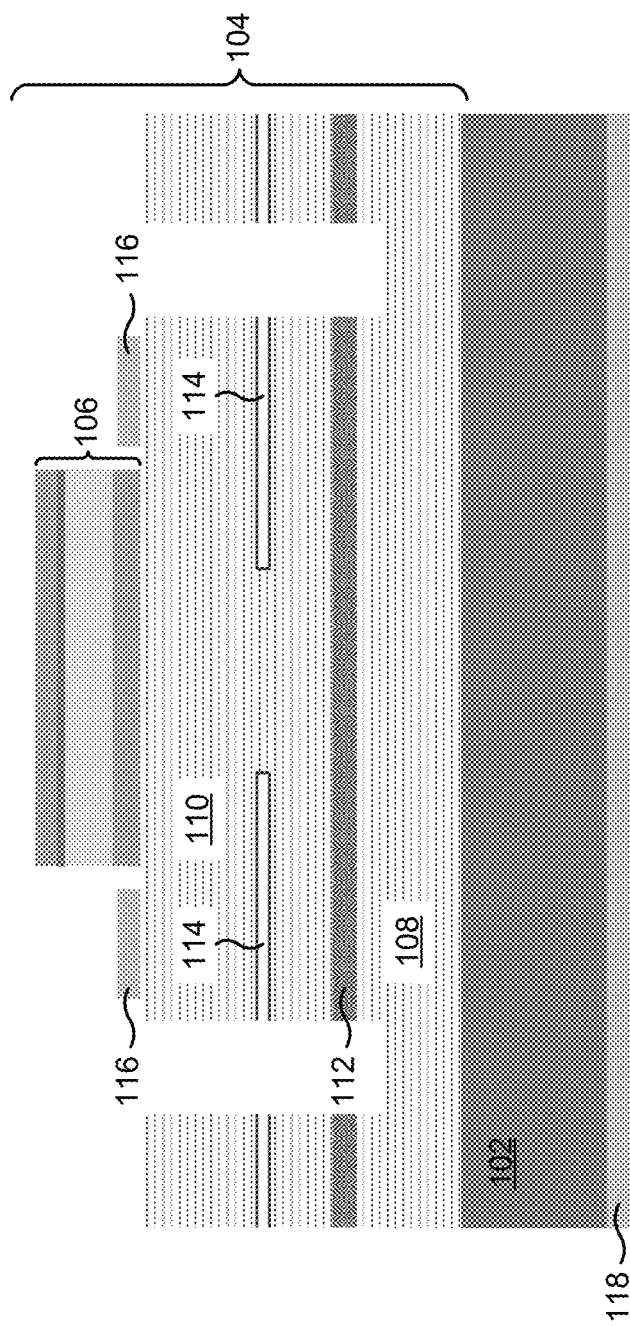
FIGS. 7A-7F are diagrams illustrating steps of example processes for forming a lens including a sloped profile.

FIG. 7A illustrates a first example step for forming oxide lens 106 including a sloped profile. As shown in FIG. 7A, a first ultra-low aluminum content layer (e.g., a GaAs layer or AlGaAs layer with near zero aluminum content) can be formed on top mirror 110. The first ultra-low aluminum content layer is illustrated in FIG. 7A as a bottom medium gray region of oxide lens 106. Next, a low aluminum content layer (e.g., an AlGaAs layer with approximately $Al_{0.1}$ or less) can be formed on the first ultra-low aluminum content layer. The low aluminum content layer is illustrated in FIG. 7A as a light gray region of oxide lens 106. Next, a high aluminum content layer (e.g., an AlGaAs layer with approximately $Al_{0.8}$ or more) can be formed on the low content aluminum layer. The high aluminum content layer is illustrated in FIG. 7A as a dark gray region of oxide lens 106. Next, a second ultra-low aluminum content layer can be formed on the high aluminum content layer. The second ultra-low aluminum content layer is illustrated in FIG. 7A as a top medium gray region of oxide lens 106.

Figure 7B:
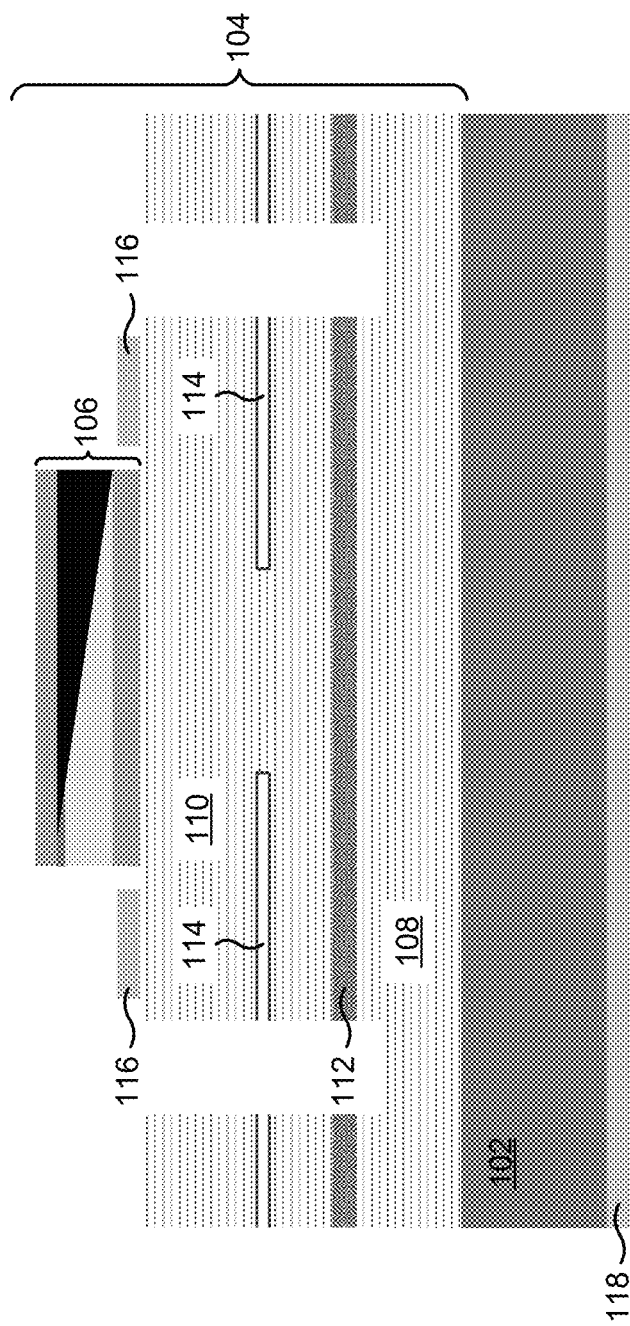

FIG. 7B illustrates a second step in which the low content aluminum layer and the high aluminum content layer are oxidized on one side to create a sloped profile within oxide lens 106. Here, because the high aluminum content layer oxidizes, while the ultra-low aluminum content layers do not experience significant oxidation, oxidation of the low aluminum content layer occurs faster nearer to the high aluminum content layer than nearer to the first ultra-low aluminum content layer. Therefore, oxidation of the high and low aluminum content layers may progress in the sloped manner illustrated in FIG. 7B. An oxidized region of oxide lens 106 resulting from oxidation of the high and low aluminum content layers is illustrated in FIG. 7B as a black triangular region.

Figure 7C:
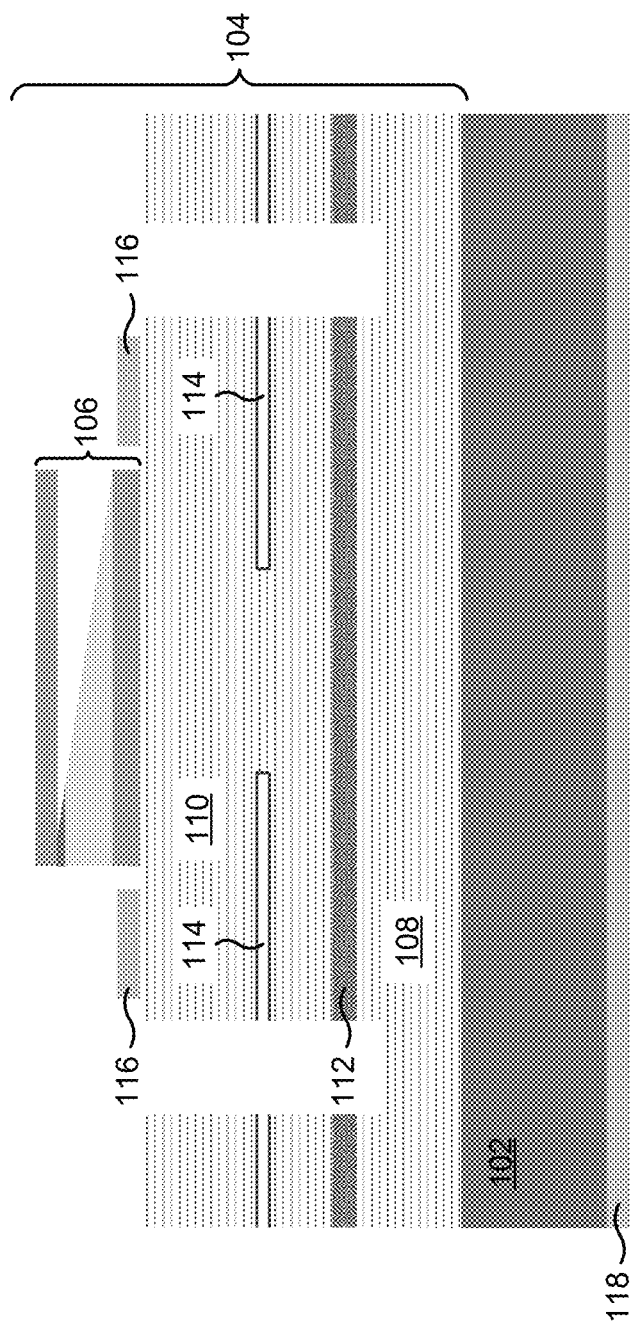

FIG. 7C illustrates a third step in which the oxidized region formed in the second step is etched away, such that the lens 106 is no longer an "oxide" lens that includes oxidized material. As shown, after etching, a cavity is present in lens 106 between the second ultra-low aluminum content layer and a surface of the remaining portions of the high and low aluminum content layers. As shown, the surface of the remaining portions of the high and low aluminum content layers has a sloped profile. Alternative to oxidation and etching described above, the high and low aluminum content layers as illustrated in FIG. 7A may be laterally wet etched with a selective etch (e.g., HCl:H20), which would etch the high aluminum content layer faster than the low aluminum content layer and also form a cavity with a sloped profile as illustrated in FIG. 7C.

Notably, while a bi-layer of comprising a low aluminum content layer and a high aluminum content layer is shown and described above, in some implementations, the composition of oxide lens 106 may be formed so as to be continuously graded in order to achieve a similar sloped profile. That is, in some implementations, a set of layers with varying aluminum content can be formed, where aluminum content within the set of layers increases in a direction from bottom to top (e.g., such that a lower layer has less aluminum than a higher layer within the set of layers). For example, the set of layers may include a set of AlGaAs layers with aluminum content that increases from zero or approximately $Al_{0.1}$ or less at or near a bottom-most layer to approximately $Al_{0.8}$ or more at a top-most layer. Here, because the aluminum content increases from bottom to top oxidation would progresses in a sloped manner similar to that shown in FIG. 7B (e.g., since a layer with lower aluminum content experiences less oxidation than a layer with higher aluminum content during the same oxidation period).

Figure 7D:
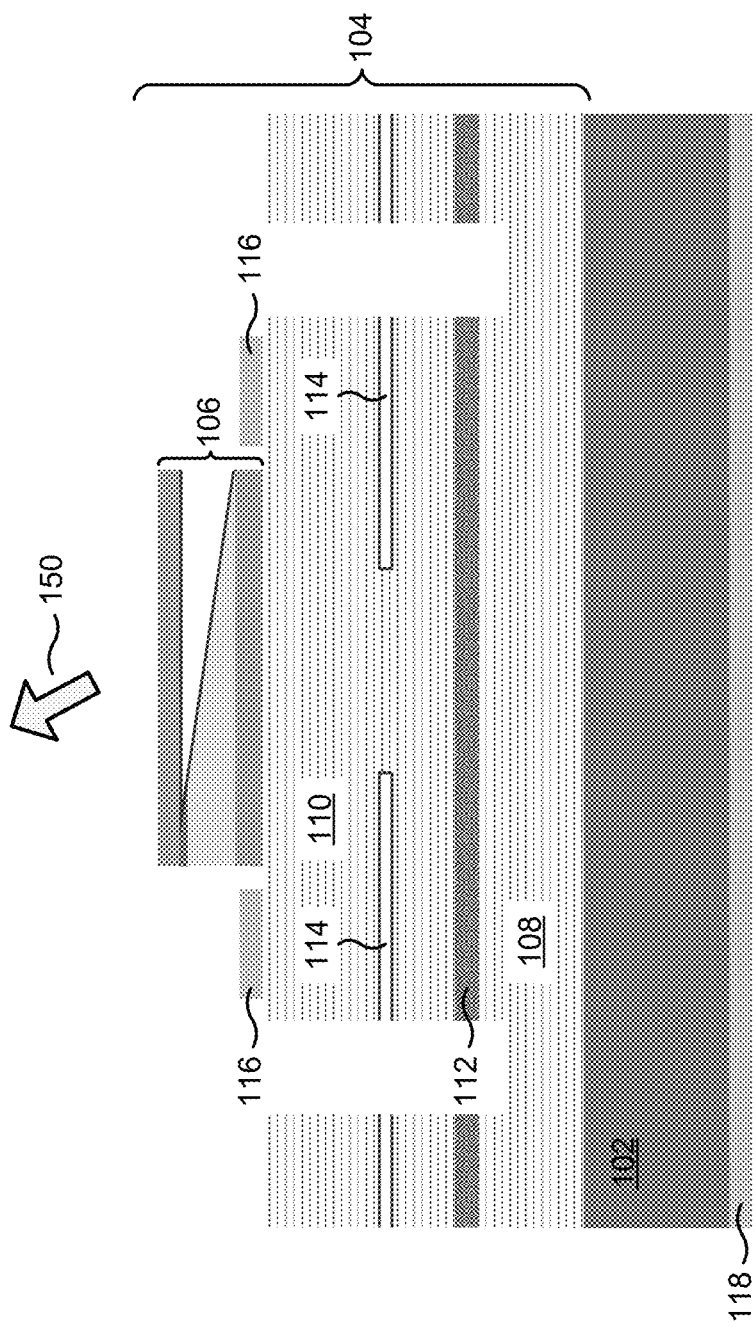

FIG. 7D illustrates a fourth step in which an AR coating (e.g., silicon nitride) is formed within the cavity of lens 106. In some implementations, the AR coating may be formed using a conformal coating method, such as like plasma enhanced chemical vapor deposition (PECVD). The AR coating is illustrated in FIG. 7D as a black line formed on surfaces of the cavity within lens 106. After formation of the AR coating, the resulting structure transmits output beam 150 an angle relative to normal, with minimal feedback to a laser cavity and minimal loss of light transmitted in unwanted directions.

Figure 7E:
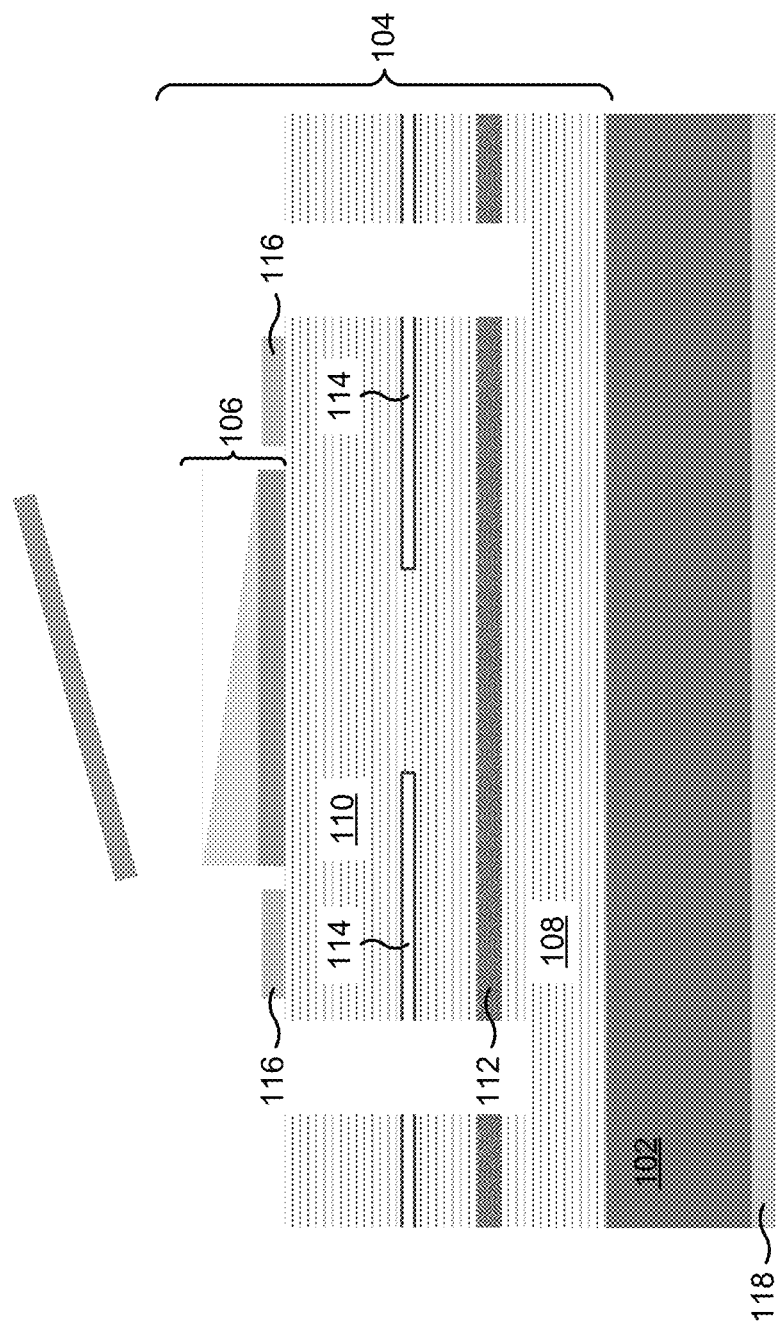
Figure 7F:
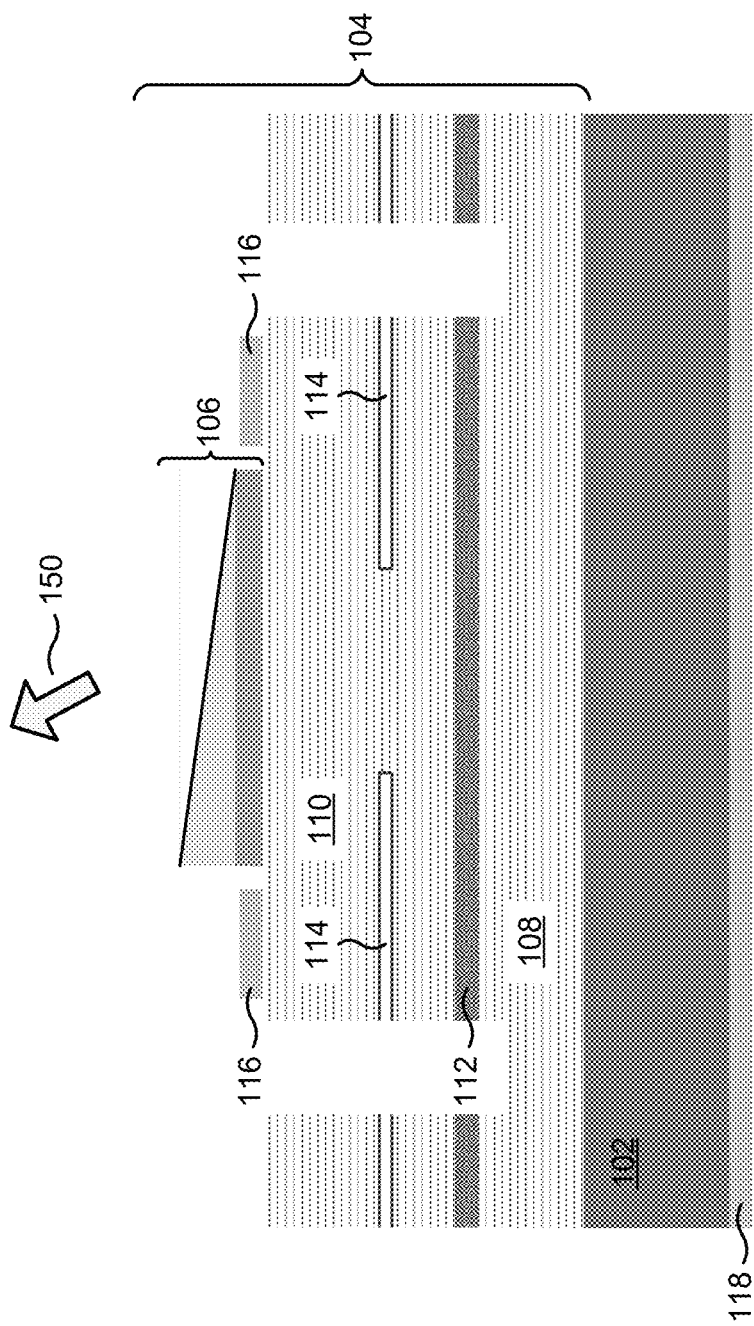

An alternative approach to that shown in FIGS. 7B-7D is to etch away a sloped cavity across an entire face of VCSEL 100 so that an upper layer (e.g., the second ultra-low aluminum content layer as shown in FIG. 7A) floats away. This approach is illustrated in FIG. 7E. Subsequently, an AR coating may be applied to a top surface of non-oxidized lens 106 (without a need to coat any overhanging structure), as shown in FIG. 7F. As with the first approach described above, the resulting structure would transmit output beam 150 at an angle relative to normal with minimal feedback to the laser cavity and minimal loss of light transmitted in unwanted directions. As shown, when using either of the above described processes, a final device structure of VCSEL 100 may have a portion of one or more layers of oxide lens 106 (e.g., an oxidized region of oxide lens 106) removed, such that the lens 106 is no longer an "oxide" lens, and an AR coating may formed on one or more exposed surfaces.

Notably, in the example approaches described in association with FIGS. 7A-7F, due to the high refractive index of AlGaAs, a relatively modest slope (e.g., 10%) is needed for significant beam-tilt (e.g., approximately 20 degrees of beam-tilt) and, therefore, only a small amount of additional epitaxy (e.g., approximately 1 to 2 µm) may be needed across a typical (e.g., 10 µm) emission aperture.

Further, while a constant slope is shown in association with FIGS. 7A-7F, a non-constant slope (e.g., a curved slope) may alternatively be formed by, for example, different grading of the aluminum composition of the layers of lens 106 or oxide lens 106.

Some implementations described herein provide a VCSEL 100 including an epitaxial structure 104 comprising an oxide lens 106 that controls an effective index of refraction encountered by output beam 150 of the VCSEL. In some implementations, a length, a thickness, an amount of tapering, a placement of layers of oxide lens 106, and/or one or more other characteristics of oxide lens 106 may provide a lensing effect that causes output beam 150 to have a desired optical characteristic. In some implementations, as described herein, oxide lens 106 may be located above or below a mirror structure (e.g., bottom mirror 108, top mirror 110) of the VCSEL, and may be separate from an oxidation layer 114 of epitaxial structure 104.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A vertical-cavity surface-emitting laser (VCSEL), comprising:
   a substrate; and
   a set of epitaxial layers on the substrate, the set of epitaxial layers including:
      a first mirror and a second mirror;
      an active region between the first mirror and the second mirror;
      an oxidation layer to provide optical and electrical confinement in the VCSEL,
         wherein the oxidation layer is near the first mirror; and
      an oxide lens to control a characteristic of an output beam emitted by the VCSEL,
         wherein the oxide lens is separate from the oxidation layer,
         wherein the oxide lens has an oxidation profile that is substantially asymmetric about an axis extending in a longitudinal direction of the VCSEL through a center of an optical aperture of the oxidation layer, such that oxidized layers of the oxide lens are on only one lateral side of the center with respect to the axis, and wherein the oxide lens is a lens that is separate from the first mirror and from the second mirror.

2. The VCSEL of claim 1, wherein the oxide lens is on a mirror surface via which the output beam is to be emitted, the mirror surface being either a surface of the first mirror or a surface of the second mirror.

3. The VCSEL of claim 2, wherein the VCSEL is a bottom-emitting VCSEL, the first mirror is a top mirror, the second mirror is a bottom mirror, and the mirror surface is a surface of the bottom mirror, wherein the oxide lens is between the substrate and the bottom mirror.

4. The VCSEL of claim 2, wherein the VCSEL is a top-emitting VCSEL, the first mirror is a top mirror, the second mirror is a bottom mirror, and the mirror surface is a surface of the top mirror.

5. The VCSEL of claim 1, wherein the set of epitaxial layers further includes a spacer layer between the active region and the oxide lens, wherein the spacer layer is to provide separation between the active region and the oxide lens.

6. The VCSEL of claim 1, wherein the characteristic of the output beam is to be controlled based on at least one of:
a number of layers included in the oxide lens,
thicknesses of one or more layers included in the oxide lens,
distances between particular pairs of layers included in the oxide lens,
composition of layers included in the oxide lens,
oxidation lengths of oxidized layers included in the oxide lens,
the oxidation profile of the oxide lens, or
a distance between the oxide lens and the active region.

7. The VCSEL of claim 1, wherein the oxide lens is to control an effective index of refraction encountered by the output beam.

8. The VCSEL of claim 1, wherein the characteristic to be controlled by the oxide lens is a beam divergence of the output beam.

9. The VCSEL of claim 1, wherein the characteristic to be controlled by the oxide lens is a beam steering angle of the output beam.

10. The VCSEL of claim 1, wherein the characteristic to be controlled by the oxide lens is a number of optical modes or a shape of an optical mode pattern.

11. The VCSEL of claim 1, wherein the oxide lens includes a set of epitaxial layer pairs, each epitaxial layer pair including an oxidized layer and a non-oxidized layer.

12. The VCSEL of claim 11, wherein an oxidation length of a first oxidized layer, included in a first epitaxial layer pair of the set of epitaxial layer pairs, is different from an oxidation length of a second oxidized layer included in a second epitaxial layer pair of the set of epitaxial layer pairs.

13. The VCSEL of claim 1, wherein the oxidation profile is associated with providing beam steering away from the VCSEL.

14. A method, comprising:
forming a first mirror, a second mirror, an active region, and an oxidation layer,
wherein the active region is formed between the first mirror and the second mirror,
wherein the oxidation layer is formed near the first mirror, and
wherein the oxidation layer is to provide optical and electrical confinement of a vertical-cavity surface-emitting laser (VCSEL); and
forming an oxide lens,
wherein the oxide lens is separate from the oxidation layer,
wherein the oxide lens is a lens that is separate from the first mirror and from the second mirror,
wherein the oxide lens has an oxidation profile that is substantially asymmetric about an axis extending in a longitudinal direction of the VCSEL through a center of an optical aperture of the oxidation layer, such that oxidized layers of the oxide lens are on only one lateral side of the center with respect to the axis, and
wherein the oxide lens is to control a characteristic of an output beam emitted by the VCSEL.

15. The method of claim 14, wherein the oxide lens is formed on a mirror surface via which an output beam is to be emitted by the VCSEL, the mirror surface being either a surface of the first mirror or a surface of the second mirror.

16. The method of claim 14, further comprising:
forming a spacer layer associated with providing separation between the active region and the oxide lens,
wherein the spacer layer is between the active region and the oxide lens.

17. The method of claim 14, wherein the characteristic of the output beam is to be controlled based on at least one of:
a number of layers included in the oxide lens,
thicknesses of one or more layers included in the oxide lens,
distances between particular pairs of layers included in the oxide lens,
composition of layers included in the oxide lens,
oxidation lengths of oxidized layers included in the oxide lens,
the oxidation profile of the oxide lens, or
a distance between the oxide lens and the active region.

18. An emitter wafer, comprising:
a substrate; and
a set of epitaxial layers on the substrate, the set of epitaxial layers including:
an active region between a first mirror and a second mirror;
an oxidation layer near the first mirror; and
an oxide lens,
wherein the oxide lens is separated from the oxidation layer by at least a portion of the first mirror or at least a portion of the second mirror,
wherein the oxide lens is a lens that is separate from the first mirror and from the second mirror,
wherein the oxide lens has an oxidation profile that is substantially asymmetric about an axis extending in a longitudinal direction of an emitter in the emitter wafer, through a center of an optical aperture of the oxidation layer, such that oxidized layers of the oxide lens are on only one lateral side of the center with respect to the axis, and
wherein the oxide lens is to control an effective index of refraction encountered by an output beam of the emitter in association with controlling a characteristic of the output beam.

19. The emitter wafer of claim 18, wherein the characteristic of the output beam is to be controlled based on at least one of:
a number of layers included in the oxide lens, thicknesses of one or more layers included in the oxide lens, distances between particular pairs of layers included in the oxide lens, composition of layers included in the oxide lens, oxidation lengths of the oxidized layers included in the oxide lens, the oxidation profile of the oxide lens, or a distance between the oxide lens and the active region.

20. The emitter wafer of claim 18, wherein the oxidation profile is associated with providing beam steering away from the emitter.

* * * * *